(12) United States Patent
Tudhope et al.

(10) Patent No.: US 7,838,793 B2
(45) Date of Patent: Nov. 23, 2010

(54) SYSTEM AND METHOD FOR TREATING SURFACES OF COMPONENTS

(75) Inventors: Andrew William Tudhope, Danville, CA (US); Raul Donate Mercado, Danville, CA (US); Thomas Bryan Casserly, Dublin, CA (US); William John Boardman, Danville, CA (US); Frederick Contreras, Livermore, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 1159 days.

(21) Appl. No.: 11/490,688

(22) Filed: Jul. 21, 2006

(65) Prior Publication Data

US 2008/0029494 A1 Feb. 7, 2008

(51) Int. Cl.
*B23K 10/00* (2006.01)

(52) U.S. Cl. .................. 219/121.48; 219/121.52; 219/121.43; 315/111.51; 118/723 R

(58) Field of Classification Search ............ 219/121.36, 219/121.4, 121.41, 121.43, 121.44, 121.59, 219/121.48, 121.52; 315/111.51; 313/231.41; 118/723 R
See application file for complete search history.

(56) References Cited

U.S. PATENT DOCUMENTS

| 4,254,456 A | * | 3/1981 | Grindle et al. .............. 362/300 |
| 5,039,376 A | | 8/1991 | Zukotynski |
| 5,224,441 A | | 7/1993 | Felts et al. ................... 118/718 |
| 6,467,425 B1 | * | 10/2002 | Neff et al. ............. 118/723 VE |
| 6,764,714 B2 | | 7/2004 | Wei et al. ..................... 427/230 |
| 7,052,736 B2 | | 5/2006 | Wei et al. ..................... 427/230 |
| 7,163,585 B2 | | 1/2007 | Nishimoto et al. .......... 118/715 |

FOREIGN PATENT DOCUMENTS

| EP | 0 202 733 B1 | 7/1991 |
| WO | WO 2006/019565 A2 | 2/2006 |

* cited by examiner

*Primary Examiner*—Mark H Paschall
(74) *Attorney, Agent, or Firm*—Schneck & Schneck

(57) ABSTRACT

A system (10) for coating surfaces of a workpiece (12) comprises a biasing system (242) for connection to said workpiece (12) and an anode (76) such as to negatively bias the workpiece relative to the anode and a vacuum source (42, 44) for evacuating an interior of the workpiece (12). A gas supply (224, 226, 228) is employed for introducing a gas containing a treatment material to said workpiece and a control system (244) controls the biasing system (242), the vacuum source (42, 44) and the gas supply (224, 226, 228) so as to establish a hollow cathode effect within the workpiece (12). A pair of coupling heads (16, 18) are supported on articulated arms (22, 24, 26) movable in one or more of three axes and include removable shields (78) to protect the heads (16, 18) and an anode mount (74) for receiving an anode (76). The articulated arms allow the system to accommodate a plurality of different shaped and different sized workpieces while the shields protect the coupling heads during a deposition process.

34 Claims, 8 Drawing Sheets

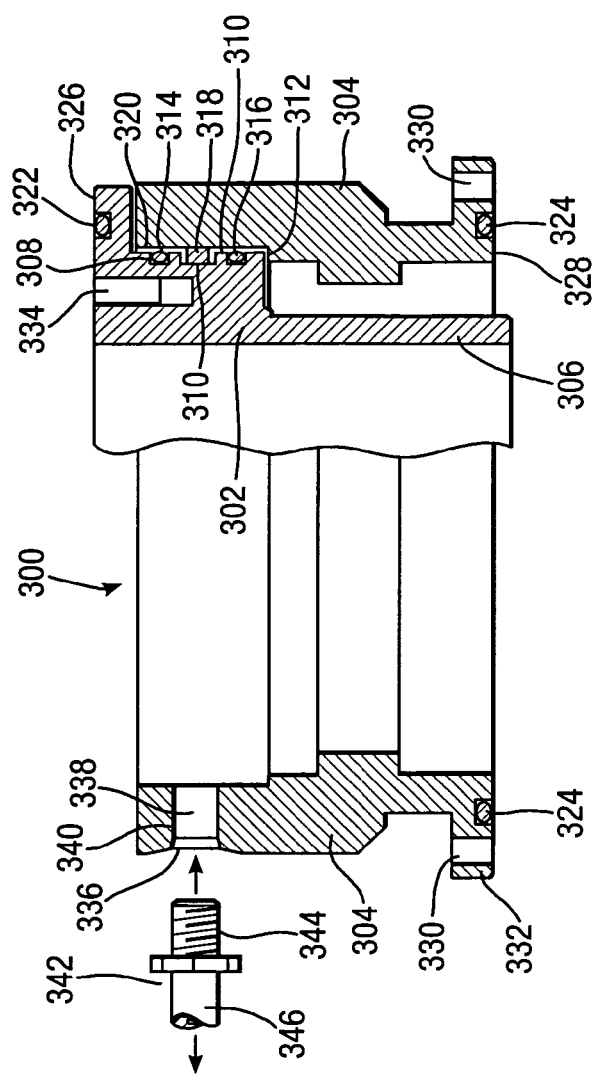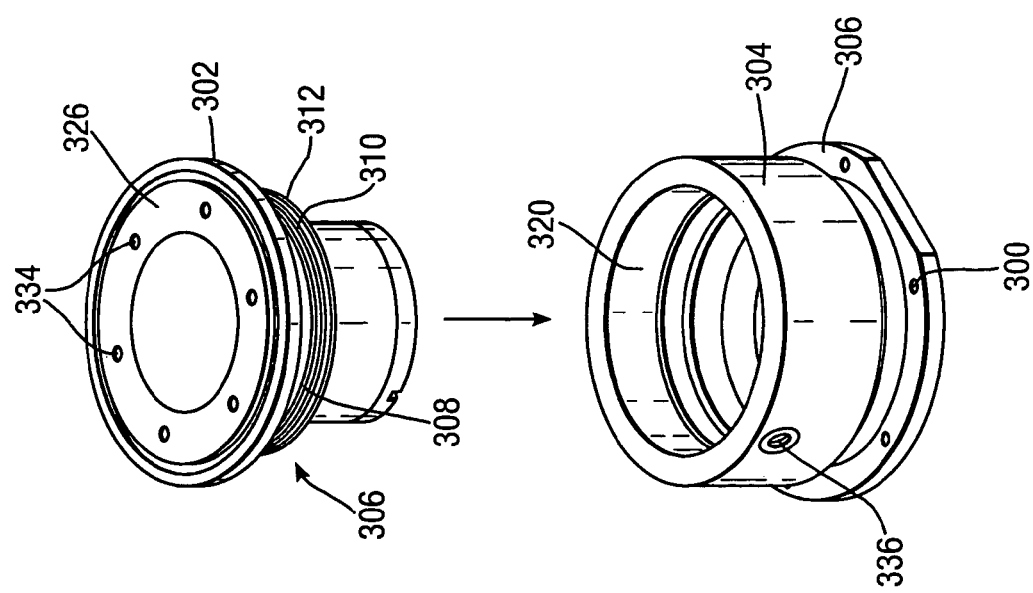

SYSTEM AND METHOD FOR TREATING SURFACES OF COMPONENTS

TECHNICAL FIELD

The present invention relates to a system and method for treating surfaces of components and relates particularly but not exclusively to such systems for use in coating or modifying the internal surfaces of components such as pipes with complex shapes and the like.

BACKGROUND ART

"Plasma enhanced chemical vapor deposition" (or PECVD) is a known technique used to form films on various substrates. For example, Felts et al., U.S. Pat. No. 5,224,441, describes an apparatus for rapid plasma deposition. In the plasma enhanced chemical vapor deposition of silicon oxide, a gas stream including components such as a volatilized organosilicon compound, oxygen, and an inert gas such as helium or argon, is sent into an enclosed chamber at reduced pressure and a glow discharge plasma is established from the gas stream or its components. A silicon oxide layer is deposited upon the substrate when it is positioned near the plasma. In such a system, the pressure is typically reduced from atmospheric pressure by a vacuum pumping system. Electrode surfaces are in electrical communication with the gases introduced into the system such that an electrical discharge or plasma is formed. The purpose of this discharge is to excite moieties in the system and cause them to be deposited onto the workpiece or substrate to be coated.

The use of the "hollow cathode effect" is known from published international patent application No. WO 2006/019565 which is owned by the assignee of the present application, in which the internal surface of tubes and pipes are modified by a treatment process in which the workpiece itself forms the deposition chamber. Treatment is effected within the workpiece by applying a biasing voltage between an electrode within the workpiece, or just at the exterior of the workpiece, and the workpiece itself while passing a treatment gas through the workpiece and maintaining the interior of the workpiece at a reduced pressure. The treatment gas contains the element to be deposited or implanted and the pressure is low enough to establish and maintain the "hollow cathode effect" in which the electron mean free path is slightly less than the diameter of the workpiece, thus causing electron oscillation and implantation or deposition of the desired element below or onto the surface of the component itself.

Plasma deposition systems (either PVD or CVD) generally employ a vacuum chamber of fixed size, with the workpiece to be coated placed in the chamber. The chamber is pumped down before a gas is introduced, and a plasma is generated by applying electrical power between electrodes in the chamber. Different size workpieces can be coated externally as long as the part does not exceed the size limitations of the chamber. However, the ability to coat internal surfaces is very limited. Published international patent application No. WO 2006/019565, which is owned by the assignee of the present application, discloses an arrangement which lends itself to the treatment of internal surfaces. In this arrangement, the pipe is sealed at either end to create a sealed volume that can be evacuated and into which can be passed a treatment gas prior to the application of a bias voltage between anodes positioned outside of the pipe and the pipe itself so as to create the plasma necessary for coating. While this arrangement provides a perfectly acceptable system for treating long components in the field, it is not easy to employ it in the treatment of complex shapes or to accommodate components of differing sizes or to accommodate component apertures of different sizes. Additionally, the anodes themselves are subjected to the coating effect and their performance deteriorates with time.

SUMMARY OF THE INVENTION

The present invention provides a system for treating a workpiece such as a pipe or the like which comprises a biasing system, for connection to a workpiece and an anode such as to negatively bias a workpiece relative to an anode; a vacuum source, for evacuating an interior of a workpiece; a gas supply, for introducing a gas containing a treatment material to said workpiece; a control system for controlling the biasing system, the vacuum source and the gas supply; and a coupling head comprising: a casing, having an inlet for receiving gas from said gas supply and an outlet for connecting with a workpiece to be treated; and a removable shield, at least partially shielding said casing from any gas introduced thereto.

In an alternative form of the present invention, there is provided a system for treating a workpiece comprising a biasing system, for connection to a workpiece and an anode such as to negatively bias a workpiece relative to an anode; a vacuum source, for evacuating an interior of a workpiece; a gas supply, for introducing a gas containing a treatment material to said workpiece; a control system for controlling the biasing system, the vacuum source and the gas supply; a pair of coupling heads comprising: an input coupling head having a casing, said casing having an inlet for receiving gas from said gas supply and an outlet for connecting with a workpiece to be treated; an output coupling head having a casing, said casing having an inlet for connection to a workpiece and for receiving gas from said workpiece and an outlet for connection with said vacuum source; and a removable shield, at least partially shielding a casing from gas introduced thereto.

Preferably, the shield comprises a circular shield having an inlet therein for receiving gas into the interior thereof and an outlet for coupling to the outlet of the coupling head. It may also include an anode aperture for receiving an anode when inserted into said casing. The casing may include an anode mounting for receiving an anode within the interior of said casing and the mount may comprise an external mount through which said anode may be inserted so as to protrude into said casing.

In order to accommodate workpieces having differing aperture sizes, one may provide a size adjustable coupling for coupling said coupling head to a plurality of different sized workpieces. Such a coupling may include an ultra-torr type fitting, which is easily altered to accommodate a number of different sized workpieces.

A further degree of adjustment is provided by way of an adjustable mount onto which said coupling head is positioned such as to allow adjustment in one or more of three axes. In one arrangement, this adjustable mount comprises a linear track, while in another arrangement it comprises an articulated arm arrangement. In a still further arrangement, the adjustable mount comprises the combination of an articulated arm and a linear track. When the adjustable mount is provided in the form of an articulated arm, it may comprise a plurality of pivotal arms, one or more of which is mounted about a substantially vertical axis for pivotal movement relative to an adjacent arm. Such an arrangement allows for the rapid alteration of the position of the coupling head, so as to speedily accommodate a change between workpieces of differing sizes. The articulated arms may be provided with an external gas supply passageway or, as described in a preferred arrangement, an internal passageway may be formed within the arms themselves such as to facilitate the passage of gas to and from the mounting heads. The use of internal passageways reduces the possibility of supply pipes becoming kinked or broken as a result of excessive arm movement and generally reduces clutter in the working environment. When provided with internal gas passageways, the arms include inlets and outlets for communication with adjacent arms, and further include a gas seal between the arms themselves, so as to ensure that gas does not escape to atmosphere. This gas seal can be differentially pumped to ensure leak integrity.

The coupling head is preferably provided with a closable opening or door through which the shield may be inserted and in which there may be positioned a viewing window so as to allow the observation of the plasma generation within the workpiece itself and to monitor the condition of the anode. A portion of the closable opening may be provided with a location surface for cooperation with a corresponding location flange provided on the shield itself so as to, at least partially, locate the shield within the housing. In order to more accurately locate the shield, it may be desirable to employ a second location surface on the head for location with a second location flange or portion on the shield itself.

In a preferred arrangement, the system comprises a pair of coupling heads substantially as described above, such as to accommodate a workpiece therebetween and for coupling to apertures on said workpiece itself. This arrangement is particularly advantageous when it is desired to process at high speed a number of different sized and different shaped workpieces.

The above system may be further provided with a cross-linking duct between the coupling heads and include two vacuum pumps provided in association with each coupling head. The cross linking allows for the use of both vacuum pumps in combination when reducing the pressure within the workpiece and separately when drawing gas through the workpiece.

It has been found that benefit can be gained from employing one or more plasma reflectors between the coupling head or heads and the workpiece itself. Such reflectors help ensure the plasma is fully developed before it enters the workpiece, and this helps ensure a more even application of the treatment to the surface thereof.

Gas may be generated or introduced in a number of different ways. For example, one may employ a pressurized source of gas, in which case a simple pressure regulator and a Mass Flow Controller (MFC) may be used between the gas source and the head. Alternatively, one may employ a gas bubbler or an evaporator.

In the above arrangements, the biasing system is configured such as to apply a voltage sufficient to generate a plasma within the workpiece and the vacuum source is configured such as to establish a hollow cathode effect.

The system employs removable anodes and shields, but may be provided with these components fitted.

According to a still further aspect of the present invention, there is provided a method of operating the system described above comprising the steps of: connecting a workpiece to said coupling head such that the outlet of said coupling head is in flow communication with an interior of said workpiece; reducing the pressure within the interior of said workpiece and applying a biasing voltage between the workpiece and the anode such as to establish a hollow cathode effect and generate a plasma within said workpiece; and introducing a gas containing a treatment material into said coupling head and passing it into said workpiece such as to allow for the deposition or implantation of treatment material.

BRIEF DESCRIPTION OF THE DRAWINGS

FIG. 9 is an exploded view of the joint between the arms shown in FIG. 2;

FIG. 10 is a partial cross-sectional view of the elements of FIG. 9 when assembled to provide a coupling assembly;

DETAILED DESCRIPTION

Figure 1:
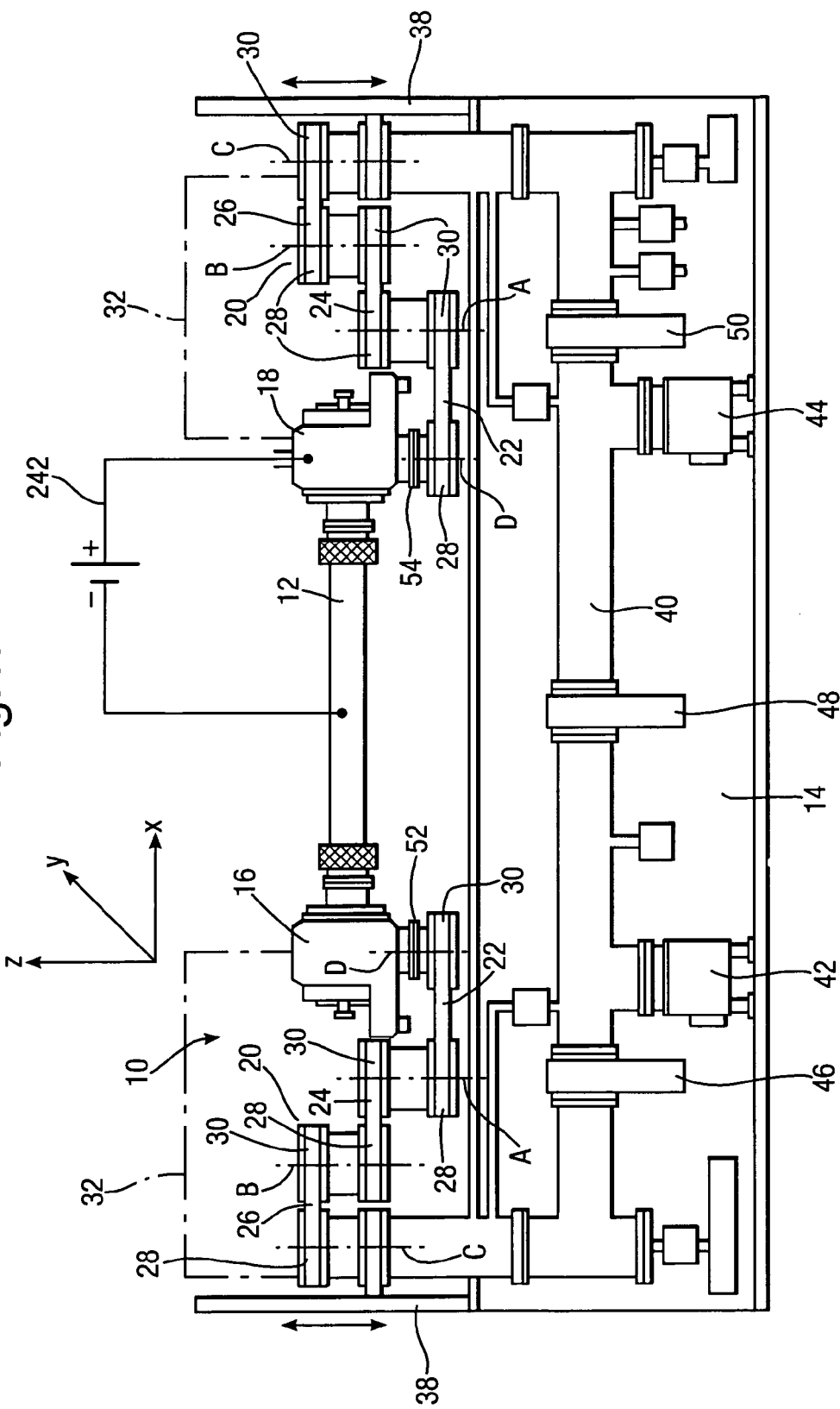
FIG. 1 is a general view of the present system and illustrates the relative positions and interactions between a workpiece and the coupling heads.
Figure 2:
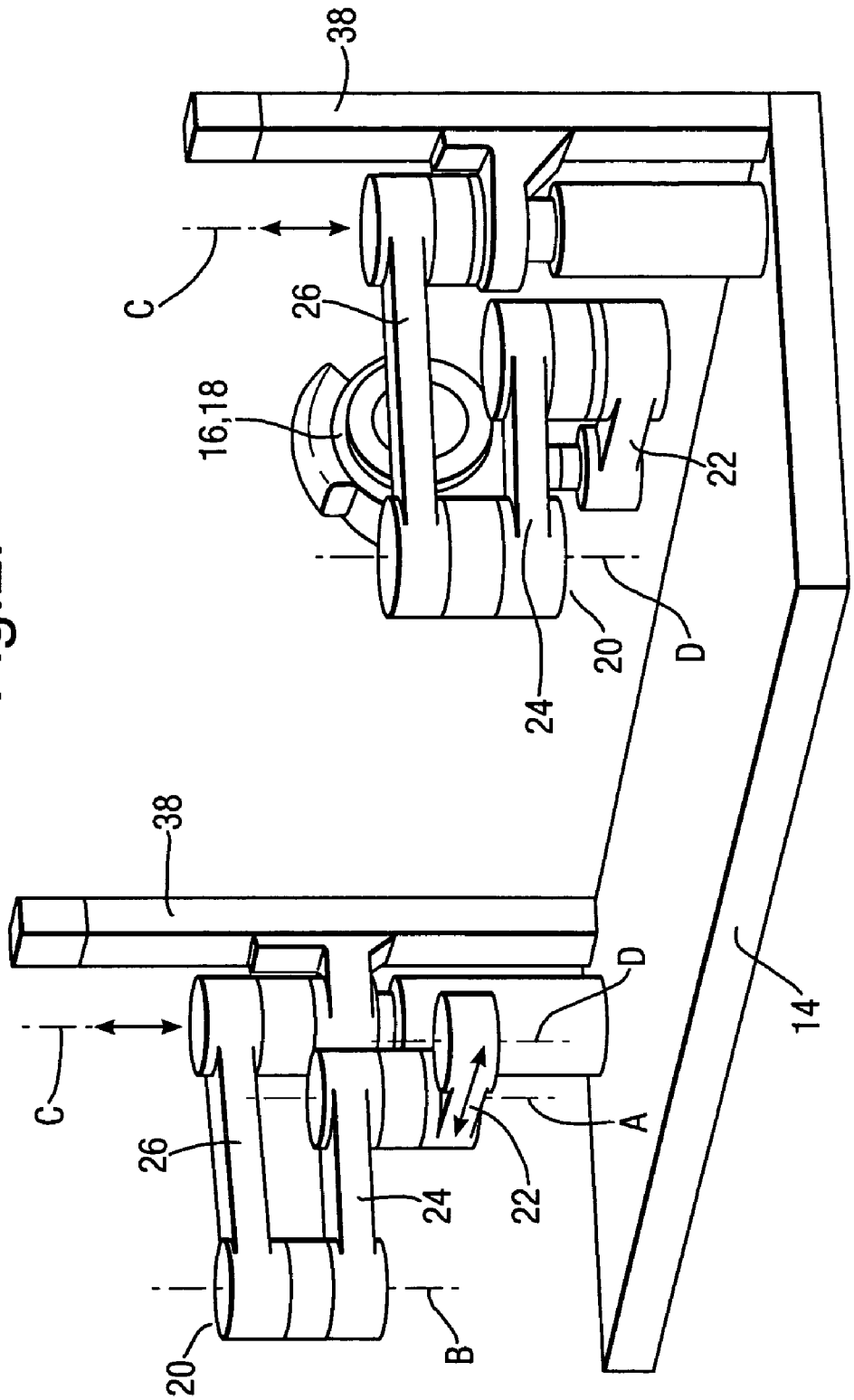
FIG. 2 is an isometric projection of portions of the system of FIG. 1 and illustrates in more detail the articulated arms and their interaction with the coupling heads.

Referring now to the drawings in general but particularly to FIG. 1, a system 10 for modifying the surface of a workpiece 12 comprises a base portion 14 upon which is mounted a first coupling head 16 and an optional second coupling head 18. One or more of the heads 16, 18 are mounted for relative movement on an articulated arm 20 (not labelled) for movement in one or more of three axes X, Y, Z. The arms themselves 20 comprise a plurality of pivotal arms 22, 24, 26, each of which is pivotable about an axis A, B, C such as to accommodate movement within axes Y and Z and are each preferably provided with an internal passageway extending from inlets 28 to outlets 30 such as to form a gas passageway, the function of which will be described in detail later herein. Optionally, gas may be supplied via an external gas supply pipe shown schematically by dotted lines 32. The arms are mounted to each other by means of a bearing mount which incorporates a gas seal and the arrangement allows the arms to pivot relative to each other whilst preventing gas escaping to atmosphere. The arrangement is best seen by referring to FIGS. 9 and 10 described in detail later herein. One end of the arm assembly is provided with a "rise and fall" mechanism shown schematically at 38 which allows the entire arm to be moved in the Z axis. Referring now to FIGS. 1 and 2 in combination, it will be appreciated that the otherwise free end of the arms is provided with the coupling heads 16, 18 which are each mounted in bearing mounts 52, 54 for rotational movement about axis D. The combination of movement about axes A to D allows the coupling heads to be speedily repositioned between desired positions and facilitates the coupling to workpieces of various shapes. A cross-linking duct 40 is provided within the base portion and acts to connect the arms to vacuum pumps 42, 44 provided within the base itself. Isolators 46, 48, 50 allow the pumps to be used together or individually to draw a vacuum from either or both ends of a workpiece 12 positioned on the system 10.

Figure 6:
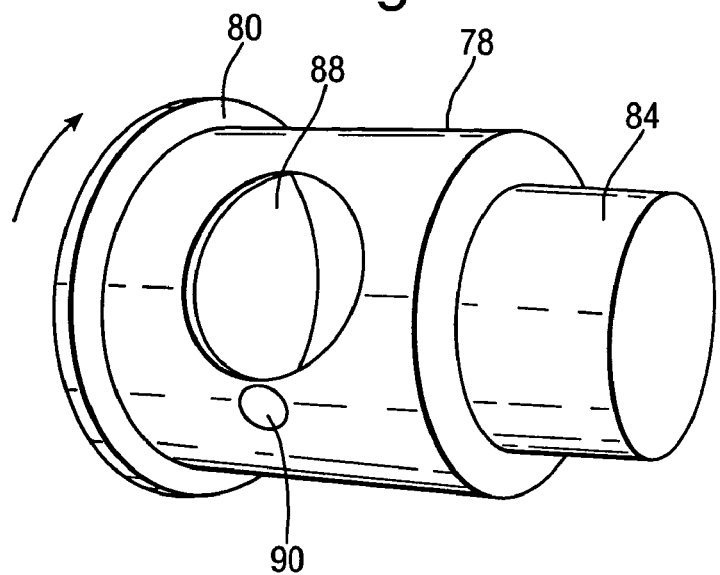
FIG. 6 is a general view of the shield shown in FIGS. 3 and 5 and illustrates the provision of apertures to allow for the passage of gas into said shield and for the insertion of an anode into the interior of said shield.

Referring now to FIGS. 1 to 6 in general, the coupling heads themselves are substantially the same and, consequently, like reference numerals will be used to denote the same components. The heads 16, 18 include an outer casing 56 having a first opening 58 connected to the gas passageway in the arms and a second opening 60 for connection with a workpiece 12 positioned between the heads. A door 62 over a further opening 64 is mounted by hinge 66 and provided with a locking mechanism 68 and seal 70 to facilitate access to the interior of the coupling head 16, 18 while also facilitating maintenance of a vacuum when required. An optional transparent window 72 may be provided in the door 62 so as to allow observation of any plasma created within the workpiece. The casing 56 is further provided with a mounting point 74 for receiving an anode 76 which extends through the casing and into the interior of the coupling head itself such that it is positioned adjacent the opening communicating with a workpiece 12. A shield 78 (best seen in FIGS. 3 and 5) is removably mounted within the head 16, 18 by means of flanged location surface 80 which engages with a corresponding location surface 82 provided on the opening portion of the head itself. The end of the shield 78 remote from flange 80 is provided with a second location flange or portion 84 which engages with a corresponding location surface 86 on the head 16, 18. FIG. 6 illustrates the shield in more detail, and further illustrates an aperture 88 for allowing treatment gas to enter the head and a further aperture 90 through which the anode 76 may be inserted.

Figure 3:
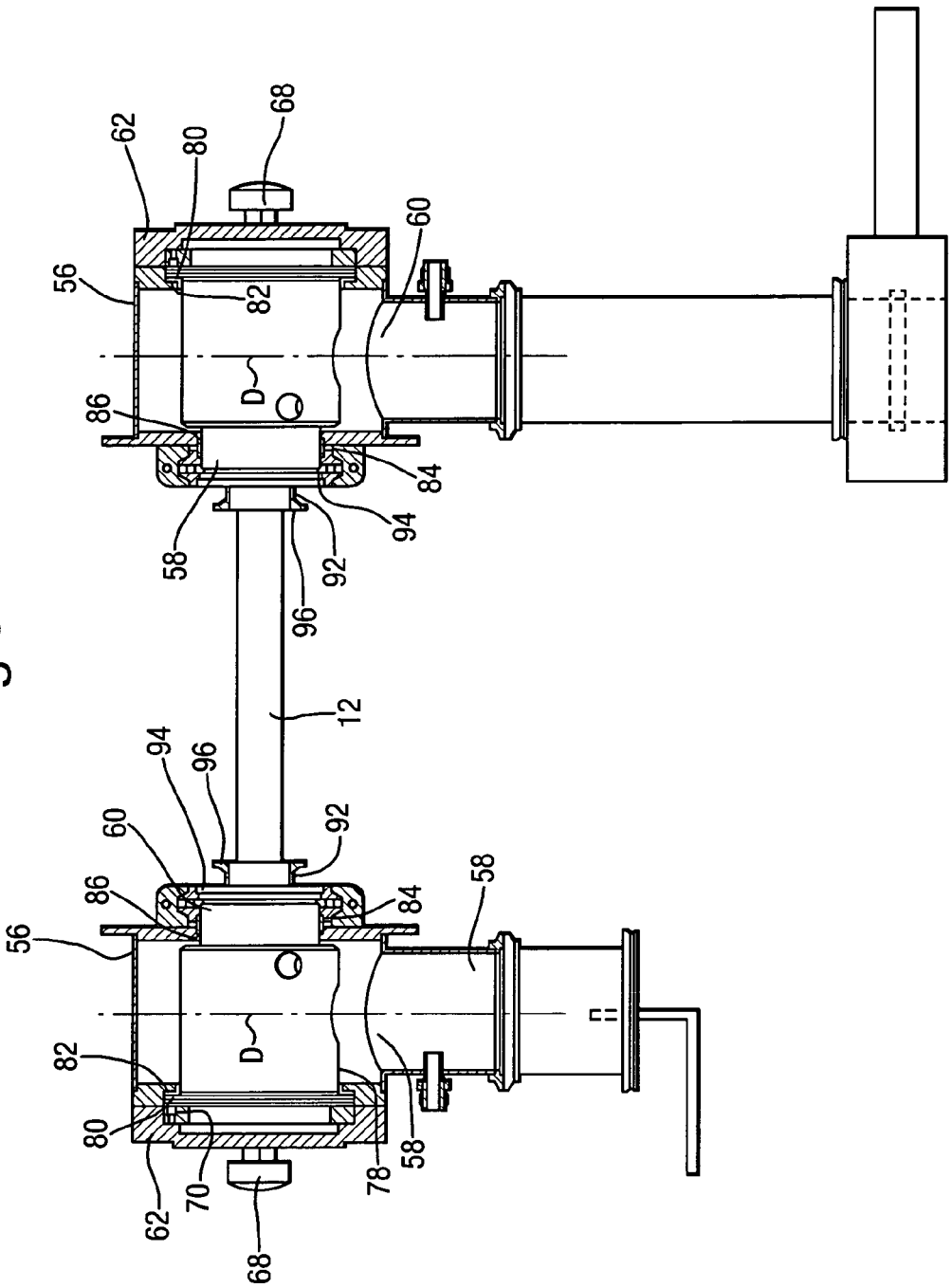
FIG. 3 is a cross-sectional view of an inlet and outlet coupling head and helps illustrate the interrelationship between the coupling heads.
Figure 4:
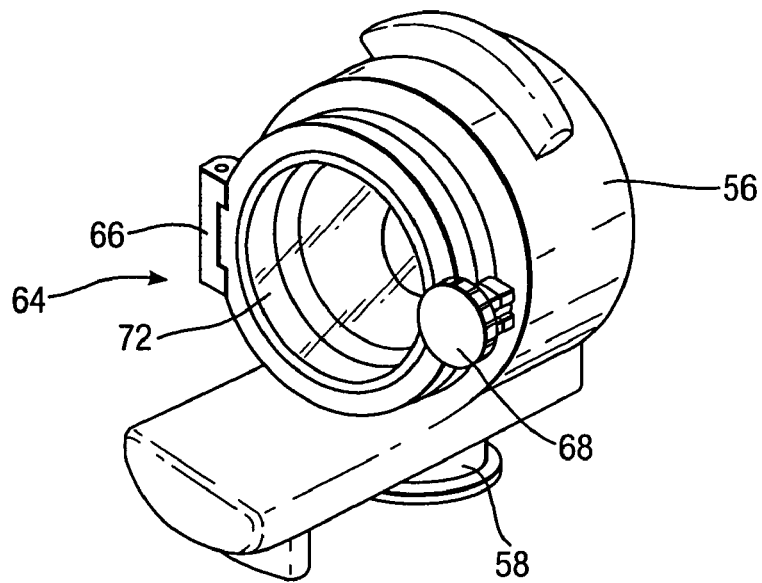
FIG. 4 is a general view of a coupling head and illustrates the position of the optional glass centered door/aperture.
Figure 5:
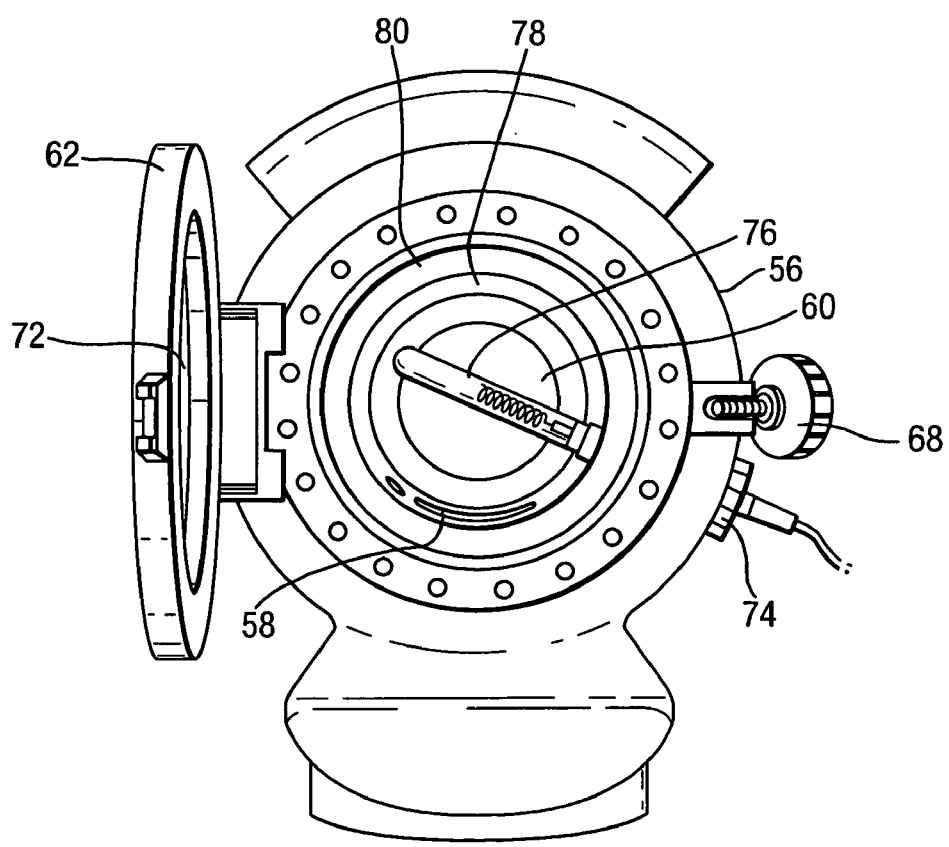
FIG. 5 is an end view of the coupling head of FIG. 4 and illustrates the position of the shield within the head and the location of the anode relative to the shield and aperture.

Referring now particularly to FIG. 3, a further component of the system includes an adjustable coupling 92 in the form of, for example, a KF100™ (4" diameter) type fitting 94 to the head 16, 18 and a 4" ultra-torr type fitting 96 to the workpiece. Other diameter workpieces (smaller or larger) can be accommodated by using a connector with different diameter Ultra-Torr™ fittings that adapt up or down to the KF100™ fitting to the head. A centering ring 98 within the KF100™ fitting is made of an insulating material, such as ceramic, to provide electrical isolation between the pipe which is biased as the cathode and the heads 16, 18. A further ceramic piece 100 can also be inserted between the outer diameter of the pipe and the inner diameter of the anode housing to prevent the formation of stray plasma on the outside of the pipe.

Figure 7:
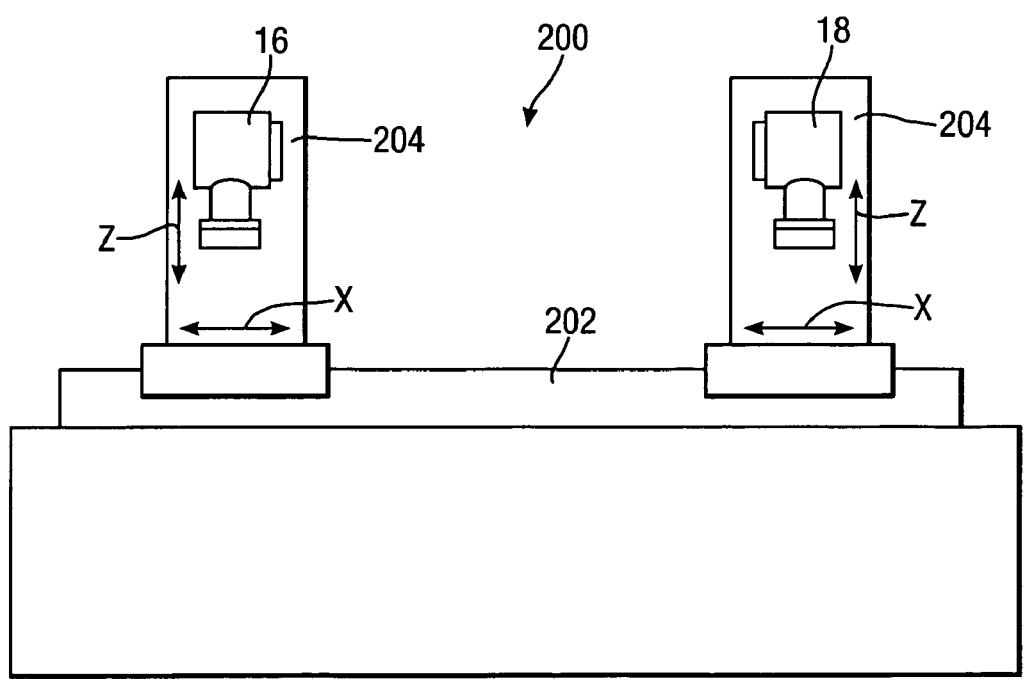
FIG. 7 is a schematic representation of an alternative form of the present system in which a linear track is employed to position the coupling heads relative to each other.

FIG. 7 illustrates an alternative system 200 in which the coupling heads 16, 18 are each mounted on a linear track arrangement 202 by means of a rise and fall mechanism shown schematically at 204. The details of the coupling heads 16, 18 and the sealing mechanism remain as described above except for the deletion of the coupling arms 22, 24, 26.

Figure 8:
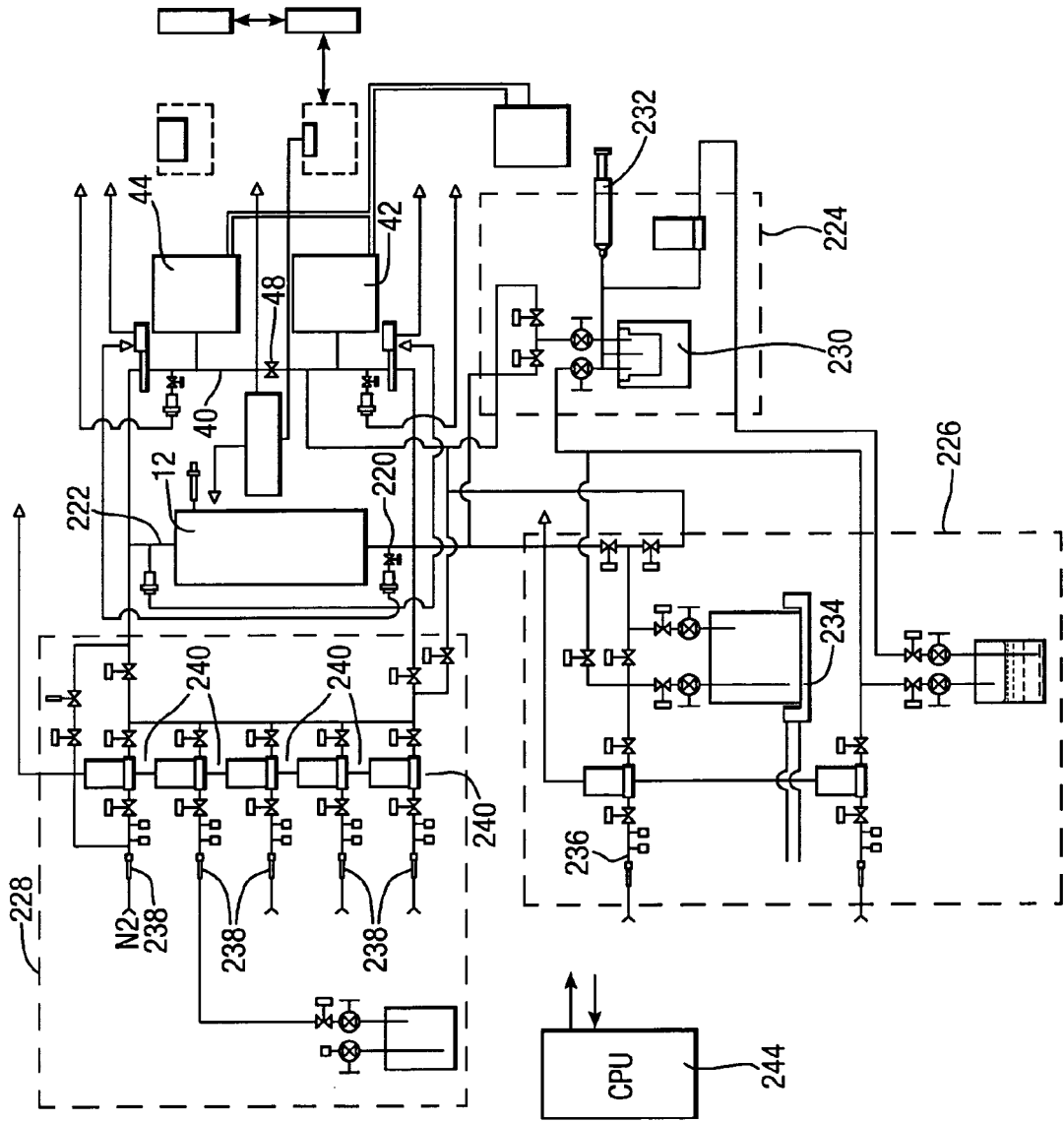
FIG. 8 is a schematic diagram illustrating the gas supply and electrical connections to the coupling head and workpiece.

FIG. 8 illustrates the gas supply and electrical connections by way of a schematic layout. The workpiece 12 is connected to the gas supply by means of connections 220, 222 which in turn are connected to the various gas supply arrangements shown generally at 224, 226 and 228. The vacuum pumps 42, 44 are shown connected to cross-linking duct 40. While it will be appreciated that various forms of gas supply may be employed, the readers' attention is drawn to an evaporator arrangement at 224 in which an evaporator 230 is provided to evaporate a source of liquid diamond like component from injection mechanism 232. This injection mechanism supplies a small amount of liquid which is completely vaporized in the heated flash evaporator 224. An inert carrier gas such as argon or nitrogen can be added to help transport the vaporized liquid to the chamber. Item 226 illustrates a heater arrangement 234 in which a precursor liquid is heated to a temperature where it has a certain vapor pressure. A carrier gas is then "bubbled" through the heated liquid such that the gas bubble picks up an amount of precursor liquid as the ratio of the vapour pressure of the liquid at that temperature and pressure over the total pressure in the bubbler. A sublimer can also be used in the case of a solid precursor. In this case, the solid is heated to generate a certain vapor pressure and a carrier gas is used to move the precursor gas to the chamber. Item 228 discloses a still further arrangement in which sources of pressurized gas shown generally at 238 is supplied via Mass Flow controllers shown generally at 240 and then directed to connections 220 and/or 222. A biasing system is shown generally at 242 and includes a source of DC power and a pulsing mechanism connected to the workpiece 12 and anode 76 as shown diagrammatically in FIG. 1. A control computer or CPU is shown schematically at 244 and is connected to the gas and electrical supply components in order to control said components as necessary during the treatment process. The control computer includes a sequencing control for controlling the selection of supply according to a desired or preprogrammed control sequence.

The operation of the above-mentioned requires the connection of a workpiece 12 to the coupling heads 16, 18 such that said heads 16, 18 are in flow series therewith and reduce the pressure within the interior of said workpiece to a desired pressure by operating vacuum pumps 42, 44. A biasing voltage is then applied between the workpiece and the cathode by means of biasing system 242 such as to establish a hollow cathode effect and generate a plasma within said workpiece itself. The control computer 244 is configured to control the application of the biasing voltage, the vacuum pumps and the gas supply so as to provide the required conditions for creating the hollow cathode effect and for deposition or implantation of treatment material. A series of gas treatment steps is then performed as necessary in order to facilitate implantation or deposition of treatment material into or onto the surface of the workpiece itself. Such processes are described in detail in published international application WO 2006/019565 and are, therefore, not described in further detail herein.

Referring now to FIGS. 9 and 10 which illustrate a coupling assembly 300 provided between arms 22, 24, 26, and from which it will be appreciated that the assembly comprises an upper and a lower portion 302, 304, respectively. The upper portion includes an outer surface 306 having three circumferentially extending grooves 308, 310 and 312 which house seals 314 and 316 on either side of a bearing shown schematically at 318. The upper portion 302 is assembled into the lower portion of the assembly such that seals 314, 316 and bearing 318 engage with an inner surface 320 on lower portion 304 and provide a gas-tight seal on either side of a bearing surface which allows one portion to rotate relative to the other so as to facilitate articulation of the arms 22, 24, 26. Also shown in FIGS. 9 and 10 are additional seals 322 and 324 provided on upper and lower surfaces 326 and 328, respectively, which, in operation, act to seal the ends of the coupling relative to the arm portion to which it is secured. In order to facilitate securing of the coupling, one may provide a series of holes 330 on a flange 332 of the lower portion 304 for receiving bolts (not shown) which may be secured into threaded holes (FIG. 12) in a lower arm. The upper portion may be provided with corresponding threaded holes 334 for receiving bolts (not shown) bolted through from an internal portion of an upper arm. Of particular interest in FIG. 10 is the evacuation outlet shown generally at 336 and which comprises a hole 338 extending through portion 304 and communicating at an inner end with the groove 312 in which the bearing 318 is situated. A portion of the hole is provided with a screw thread 340 for receiving a pipe fitting 342 having a corresponding thread portion 344 provided at one end and a flexible tube 346 on an otherwise free end. The flexible tube 346 is, in turn, operably connected to an evacuation pump 42, 44 of FIG. 1 or a separate pump (not shown). A series of coupling bearings may be linked by means of a manifold tube system (not shown). In operation, a reduced pressure is maintained between the seals 314 and 316 such as to purge any treatment gas passing through the arms and escaping into the bearing portion of the coupling. Such a system is also referred to herein as being "differentially pumped".

Figure 11:
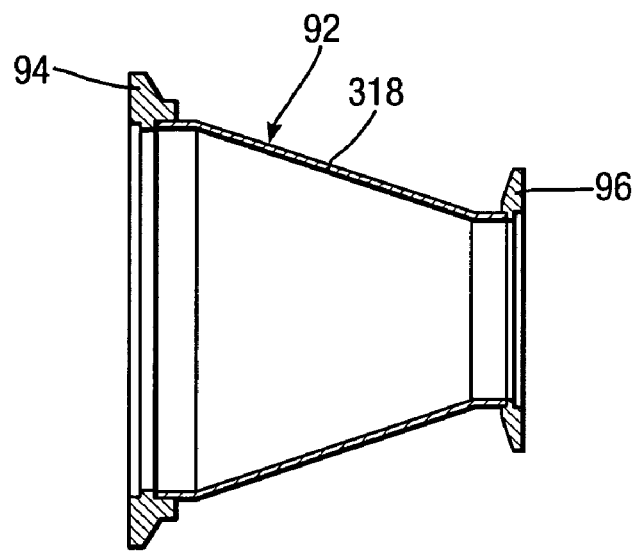
FIG. 11 is a cross-sectional view of a plasma shield suitable for use with the above-mentioned system.
Figure 12:
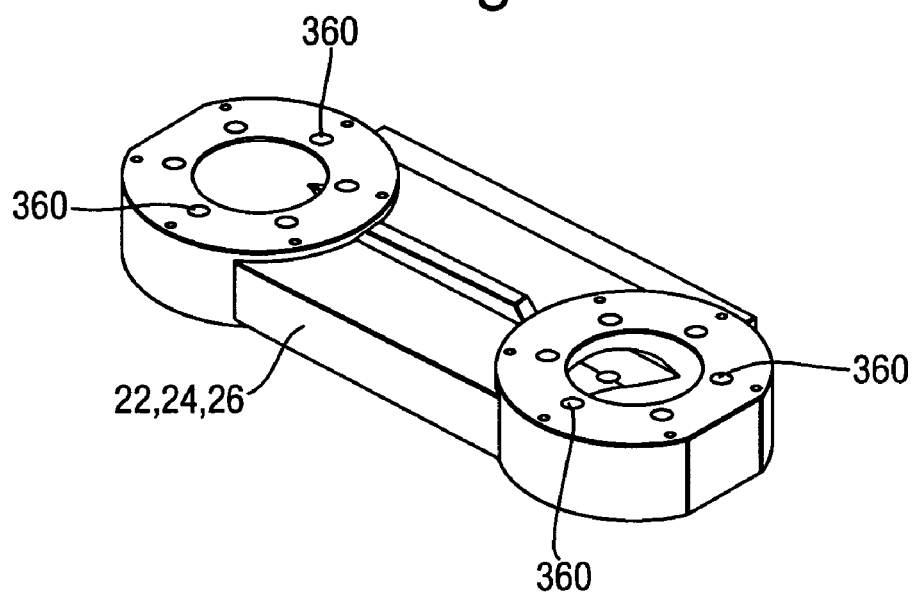
FIG. 12 is a perspective view of an arm portion.

FIG. 11 illustrates an alternative to the coupling 92 shown in FIG. 3. In this alternative, the walls 318 taper between the fittings 94, 96 which allows for the plasma created therein to fully develop before it enters the component to be coated. In effect, the walls act like deflectors funnelling the created plasma as it passes through this section. FIG. 12 provides a perspective view of the arm arrangement 22, 24, 26 and illustrates the bolting positions 360 provided to allow the portions 304, 306 of the coupling member 300 of FIGS. 9 and 10 to be secured to their respective arm portions.

What is claimed is:

1. A system for treating an electrically conductive workpiece having an exterior and an interior comprising:
    a biasing system, for connection to a workpiece and an anode such as to negatively bias a workpiece relative to an anode;
    a vacuum source, for evacuating an interior of a workpiece that is sealed, while being treated, from an exterior of the workpiece;
    a gas supply, for introducing a gas containing a treatment material to said interior of the workpiece;
    a control system for controlling the biasing system, the vacuum source and the gas supply; and
    a coupling head sealing the workpiece and comprising:
        a casing, having an inlet for receiving gas from said gas supply and an outlet for connecting with said interior of the workpiece to be treated; and
        a removable shield, at least partially shielding said casing from any gas introduced thereto.

2. The system of claim 1 wherein said shield comprises a circular shield having an inlet therein for receiving gas into the interior thereof and an outlet for coupling to the outlet of the coupling head.

3. The system of claim 1 wherein said shield includes an anode aperture for receiving an anode when inserted into said casing.

4. The system of claim 1 wherein said casing includes an anode mount for receiving an anode within the interior of said casing.

5. The system of claim 1 wherein said anode mount comprises an external mount through which said anode may be inserted so as to protrude into said casing.

6. The system of claim 1 further including a size adjustable coupling for coupling said coupling head to a plurality of different sized workpieces.

7. The system of claim 6 wherein said coupling includes an ultra-torr type fitting.

8. The system of claim 1 further comprising an adjustable mount onto which said coupling head is positioned and in which said mount is adjustable in one or more of three axes.

9. The system of claim 8 wherein said adjustable mount comprises a linear track.

10. The system of claim 8 wherein said adjustable mount comprises an articulated arm.

11. The system of claim 8 wherein said adjustable mount comprises an articulated arm and a linear track.

12. The system of claim 8 wherein said adjustable mount comprises a plurality of pivotal arms, one or more of which is mounted about a substantially vertical axis for pivotal movement relative to an adjacent arm.

13. The system of claim 8 wherein said adjustable mount comprises an articulated arm and includes a gas passageway for conveying gas to said coupling head.

14. The system of claim 8 wherein said adjustable mount comprises an articulated arm having an interior gas passageway for conveying gas to said coupling head.

15. The system of claim 8 wherein said adjustable mount comprises a plurality of pivot arms mounted in bearings for pivotal movement relative to an adjacent arm.

16. The system of claim 8 wherein said adjustable mount comprises a plurality of pivot arms having gas passageways therethrough and inlets and outlets for communication with adjacent arms and having a gas seal between one or more of each pair of arms.

17. The system of claim 1 wherein said coupling head includes a closable opening having a location surface, and said shield includes a corresponding location flange and in which said shield is at least partially located within said housing by interaction of said location flanges.

18. The system of claim 17 wherein said closable opening includes a door having a transparent portion.

19. The system of claim 1 wherein said coupling head further includes a second location surface and said shield includes a second location flange.

20. The system of claim 1 further comprising two coupling heads located for accommodating a workpiece therebetween and for coupling to apertures provided in said workpiece.

21. The system of claim 20 wherein said gas supply includes a cross link between said coupling heads and includes two vacuum pumps, each of said vacuum pumps being connected to said cross link for evacuation of gas therein and further including an isolator valve between said pumps for isolating said pumps from each other.

22. The system of claim 1 comprising one or more vacuum pumps connected to said one or more coupling heads.

23. The system of claim 1 further including one or more plasma reflectors at an outlet from said one or more coupling heads.

24. The system as claimed in claim 23 wherein said one or more plasma reflectors comprise tapered reflectors.

25. The system of claim 1 wherein said gas supply includes a gas reservoir of one or more different gases and said control system includes a gas sequencing control for controlling the selective introduction of said one or more different gases to said system.

26. The system of claim 25 wherein said gas supply includes a heater for heating a liquid so as to produce said gas.

27. The system of claim 25 wherein said gas supply includes an evaporator for evaporating a liquid source of material.

28. The system of claim 25 wherein said gas supply includes a source of pressurized gas and a pressure controller for controlling the pressure and supply thereof.

29. The system of claim 1 wherein said biasing system is configured to apply a voltage such that a plasma is generated within said workpiece.

30. The system of claim 1 wherein said control system is configured for regulating said vacuum source and said gas source such as to establish a hollow cathode effect within said workpiece.

31. The system of claim 1 including an anode.

32. The system of claim 1 including a shield.

33. A system for treating an electrically conductive workpiece having an exterior and an interior comprising:
- a biasing system, for connection to a workpiece and an anode such as to negatively bias a workpiece relative to an anode;
- a vacuum source, for evacuating an interior of a workpiece that is sealed, while being treated, from an exterior of the workpiece;
- a gas supply, for introducing a gas containing a treatment material to said interior of the workpiece;
- a control system for controlling the biasing system, the vacuum source and the gas supply; and
- a pair of coupling heads sealing the workpiece and comprising: an input coupling head having a casing, said casing having an inlet for receiving gas from said gas supply and an outlet for connecting with said interior of the workpiece to be treated; an output coupling head having a casing, said casing having an inlet for connection to and a said interior of the workpiece and for receiving gas from said workpiece and an outlet for connecting with said vacuum source; and a removable shield, at least partially shielding a casing from gas introduced thereto.

34. A method of operating the system of claim 1 further comprising the steps of:
- connecting a workpiece to said coupling head such that the outlet of said coupling head is in flow communication with an interior of said workpiece;
- reducing the pressure within the interior of said workpiece and applying a biasing voltage between the workpiece and the cathode such as to establish a hollow cathode effect and generate a plasma within said workpiece; and
- introducing a gas containing a treatment material into said coupling head and passing it into said workpiece such as to allow for the deposition or implantation of treatment material.

* * * * *